United States Patent [19]

Yoshioka

[11] Patent Number: 4,494,304
[45] Date of Patent: Jan. 22, 1985

[54] FORMING CHAN-STOPS BY SELECTIVELY IMPLANTING IMPURITY IONS THROUGH FIELD-OXIDE LAYER DURING LATER STAGE OF MOS-DEVICE FABRICATION

[75] Inventor: Kentaro Yoshioka, Tokyo, Japan

[73] Assignee: Oki Electric Industry Co., Ltd., Tokyo, Japan

[21] Appl. No.: 585,584

[22] Filed: Mar. 2, 1984

[30] Foreign Application Priority Data

Mar. 4, 1983 [JP] Japan .................. 58/34426

[51] Int. Cl.$^3$ ............... H01L 21/265; H01L 29/78
[52] U.S. Cl. ........................ 29/578; 29/571; 29/576 B; 29/576 W; 148/1.5; 148/187; 357/91
[58] Field of Search ............ 29/578, 571, 576 B, 29/576 W; 148/1.5, 187; 357/91

[56] References Cited

U.S. PATENT DOCUMENTS

| | | | |
|---|---|---|---|
| 4,140,547 | 2/1979 | Shibata | 148/1.5 |
| 4,354,309 | 10/1982 | Gardiner et al. | 29/571 |
| 4,366,613 | 1/1983 | Ogura et al. | 29/571 |
| 4,406,049 | 9/1983 | Tam et al. | 29/571 |
| 4,441,941 | 4/1984 | Nozawa | 148/187 |
| 4,444,605 | 4/1984 | Slawinski | 148/187 |
| 4,455,193 | 6/1984 | Jeuch | 29/571 |

Primary Examiner—Upendra Roy
Attorney, Agent, or Firm—Wenderoth, Lind & Ponack

[57] ABSTRACT

A MOS type semiconductor device is manufactured by forming a polycrystalline silicon gate electrode in an active region of a semiconductor silicon substrate, forming diffused layers in the substrate, the diffused layers being of a conductivity type opposite to that of the substrate, forming a relatively thick oxide film on the polycrystalline silicon gate electrode, depositing on the oxide film, a silicon nitride film, another oxide film, and a resin film to a thickness smaller than that of the relatively thick oxide film, forming channel stop layers and exposing the polycrystalline silicon film on the diffused layers to form electrode.

7 Claims, 19 Drawing Figures (a)

(b)

(c)

(d)

(e)

(a)

(b)

(c)

(d)

(e)

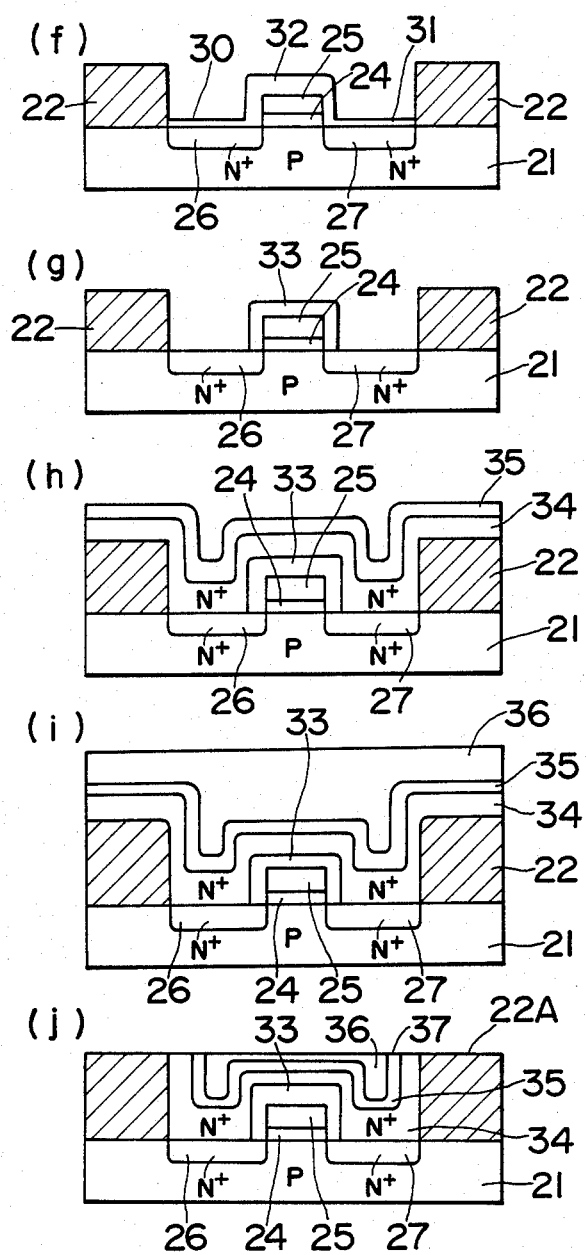
FIG_2

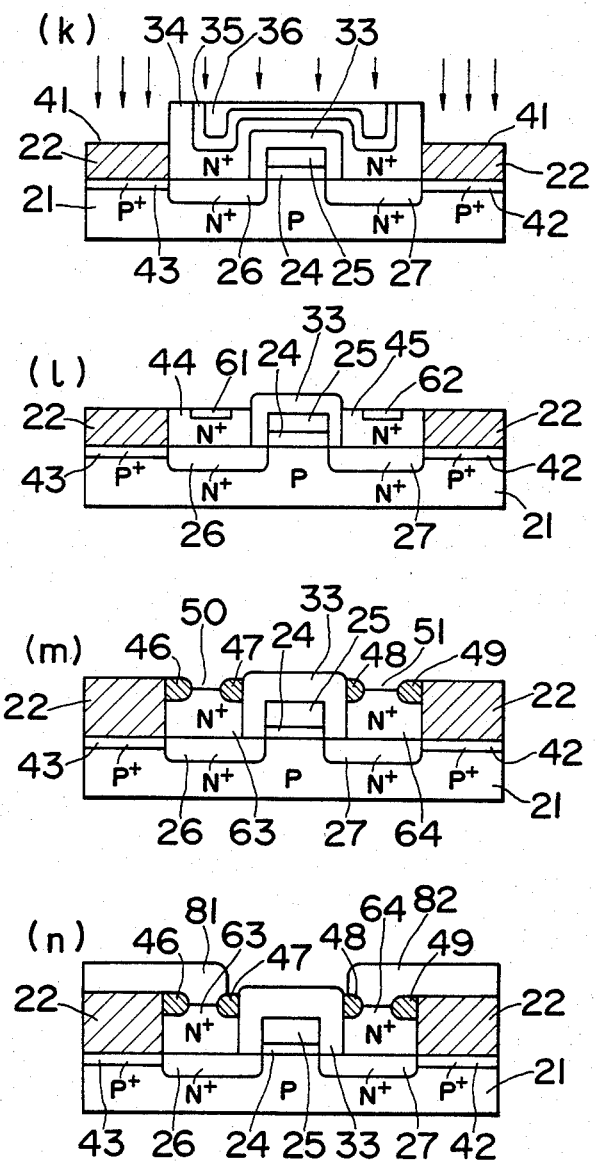

FORMING CHAN-STOPS BY SELECTIVELY IMPLANTING IMPURITY IONS THROUGH FIELD-OXIDE LAYER DURING LATER STAGE OF MOS-DEVICE FABRICATION

BACKGROUND OF THE INVENTION

This invention relates to a method of manufacturing a MOS type semiconductor device capable of forming an active region having a small parasitic junction capacitance formed between the source or drain region and the channel stopper, and capable of forming contacts to the source and drain regions by self aligning method and making flat the surface of the semiconductor device.

In recent years, a selective oxidation process has been widely used for manufacturing semiconductor devices.

At first, a typical prior art method of manufacturing a MOS type semiconductor device will be described with reference to FIGS. 1a through 1e. As shown in FIG. 1a, a heat oxidized film 2 and a nitride film 3 are formed on a silicon substrate 1.

Then as shown in FIG. 1b, the nitride film 3 is selectively etched to form a nitride film pattern 4. At this time, channel stop layers 81 and 82 are formed by ion injection at portions other than the nitride film pattern 4 so as to prevent the generation of inversion layer under a thick field oxide region.

Then the assembly is subjected to heat oxidation to form a thick field oxide film 5 on portions outside of the nitride film mask 4 as shown in FIG. 1c. When the nitride film is used as an oxidation resistant mask, bird's beak regions invade under it to lift the opposite ends 83 and 84 thereof.

By removing the nitride film, a structure as shown in FIG. 1d is obtained in which a portion 6 becomes an active region. Thereafter predetermined well known steps are performed to obtain the fundamental structure of a MOS type semiconductor device as shown in FIG. 1e.

In FIG. 1e, 11, 12 and 13 represent aluminum electrodes for wiring, 7 and 8 diffused layers being of a conductivity type opposite to that of the silicon substrate, 10 a gate insulating film, 9 a polycrystalline silicon gate electrode, and 14 an interlayer insulating film.

Although above-described prior art method of manufacturing a MOS type semiconductor device is a very simple method, it has the following defects.

(1) Since bird's beaks are formed at the ends of the oxidized film 5, miniaturization of the device is difficult.

(2) After forming the channel stop layers a number of high temperature (about 1000° C.) heat treating steps such as heat oxidation are required so that the channel stop layers 81 and 12 are deepened to increase the junction capacitance between the channel stop layer and source and drain regions, thus causing delay of the operating speed.

(3) Since the openings through a thick insulating film have sharp sloped walls, the aluminum electrodes 11 and 13 to source and drain regions tend to break.

Accordingly, it is necessary to form sufficiently large openings enough to facilitate mask alignment at the time of the contact photolithographic step and to ensure a sufficient margin for the electroconductive diffused layer, thus making it difficult to miniaturize the semiconductor device.

For the reasons described above, with the prior art method of manufacturing it has been extremely difficult to miniaturize the MOS type semiconductor device.

SUMMARY OF THE INVENTION

Accordingly, it is an object of this invention to provide an improved method of manufacturing a MOS type semiconductor device in which the junction capacitance due to overlapping of electroconductive diffused layers is small, the electroconductive diffused layers can be prepared with self-aligning process and can be readily miniaturized.

Another object of this invention is to provide a method of manufacturing a MOS type semiconductor device capable of preventing formation of birds' beaks at the ends of a thick oxidized layer thus enabling miniaturization of an active region and preventing a narrow channel effect.

Still another object of this invention is to provide an improved method of manufacturing a MOS type semiconductor device having a smooth and flat surface and capable of readily forming electrical contacts to electroconductive diffused layers.

According to this invention there is provided a method of manufacturing a MOS type semiconductor device comprising the steps of forming a relatively thick oxide film on a semiconductor substrate; removing a portion of the oxide film to expose a portion of the semiconductor substrate which is used to form an active region; forming a polycrystalline silicon gate electrode on the exposed portion of the semiconductor substrate; forming diffused layers being of a conductivity type opposite to that of the semiconductor substrate in the exposed portion thereof; forming an oxide film on the polycrystalline silicon gate electrode; depositing a polycrystalline silicon film, a silicon nitride film and a resin film on the polycrystalline silicon gate electrode to form a flat surface such that the flat surface of the active region would lie at a level lower than the upper surface of the relatively thick oxide film; etching off the relatively thick oxide film to a predetermined thickness by utilizing the polycrystalline silicon film, the silicon nitride film, and the resin film as a mask; implanting ions of an impurity into the semiconductor substrate to form channel stop layers; and exposing the polycrystalline silicon film on the diffused layers to form electrodes.

DESCRIPTION OF THE PREFERRED EMBODIMENT

A preferred embodiment of the method of manufacturing a MOS type semiconductor device of this invention will now be described with reference to FIGS. 2a through 2h.

Figure 1:
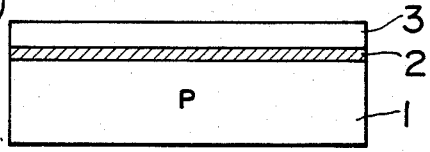
FIGS. 1a through 1e are sectional views showing successive steps of a prior art method of manufacturing a MOS type semiconductor device.
Figure 1:
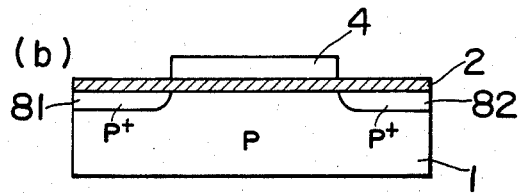
Figure 1:
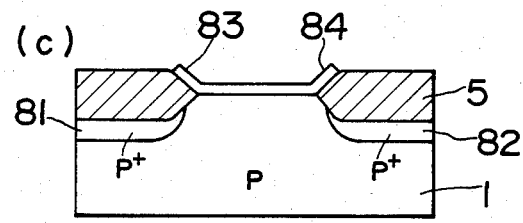
Figure 1:
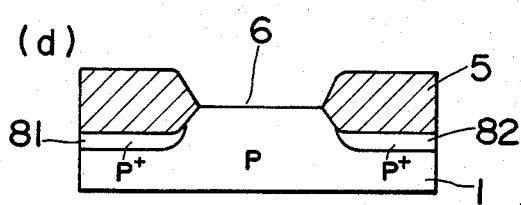
Figure 1:
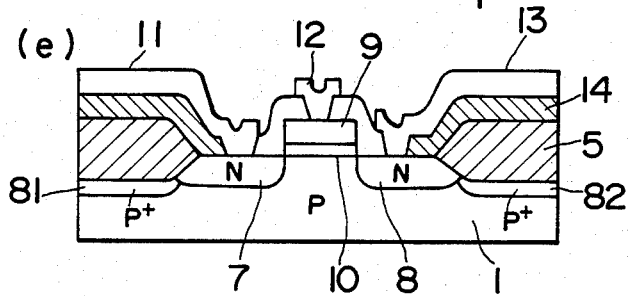
Figure 2:
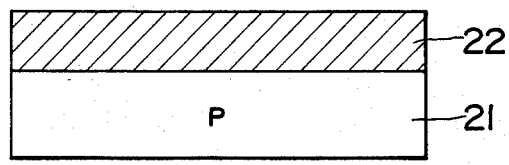
FIGS. 2a through 2n are sectional views showing successive steps of the method of manufacturing a semiconductor device according to this invention.
Figure 2:
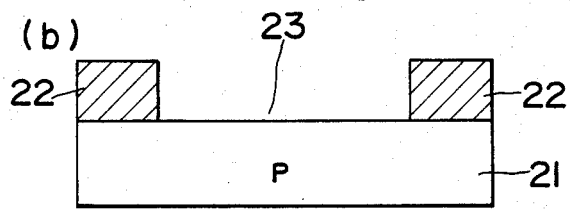
Figure 2:
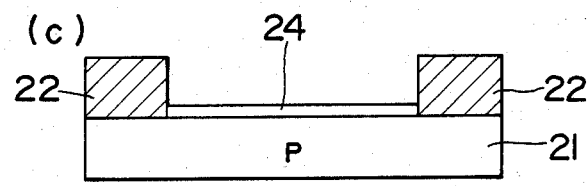
Figure 2:
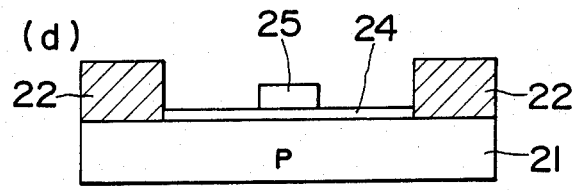
Figure 2:
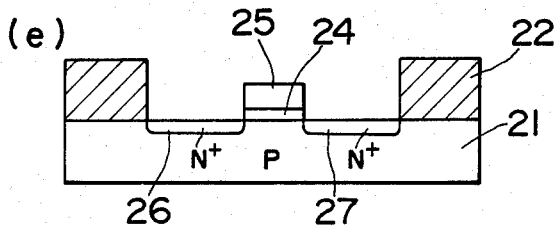

At first, as shown in FIG. 2a, a relatively thick oxide film 22 is formed to a desired thickness, for example 0.5–1$\mu$, by heat oxidation or CVD process, on a P type semiconductor silicon substrate 21 having an impurity concentration of $10^{14}$–$10^{15}$/cm$^3$, for example.

Then a portion of the oxide film 22 is selectively removed by well known photo-etching technique to expose an active region, thus obtaining a structure shown in FIG. 2b.

Furthermore, a thin (for example 200–400Å) silicon oxide gate film 24 is formed on the active region 23 by heat oxidation process as shown in FIG. 2c.

Then as shown in FIG. 2d, an electroconductive polycrystalline silicon gate electrode 25 is formed on the thin silicon oxide gate film 24.

Then as shown in FIG. 2e, by ion implantation process or the like N conductivity type diffused layers 26 and 27 having an impurity concentration of $10^{20}/cm^3$, for example, are formed in the upper surface of the silicon substrate 21.

After that as shown in FIG. 2f, oxide films 30 and 31 are formed on the N conductivity type diffused layers 26 and 27 heat oxidation treatment while a drive-in diffusion of these layers 26 and 27 is carried out. At the same time, an oxide film 32 covering the polycrystalline silicon gate electrode 25 is also formed.

At this time, since the oxidation speed of the polycrystalline silicon film which generally contains impurities is much larger than that of the semiconductor monocrystalline silicon, the thickness of the oxide film 32 can be made much larger than that of the oxide films 30 and 31.

Then the oxide films 30 and 31 on the N conductivity type diffused layers 26 and 27 are removed by etching in which the difference in the film thicknesses is utilized to leave the oxide film 33 only about the polycrystalline silicon film thus obtaining a structure as shown in FIG. 2g.

Then as shown in FIG. 2h, a polycrystalline silicon film 34 containing an impurity at a concentration of $10^{20}$–$10^{21}/cm^3$, for example, and a silicon nitride film 35 are formed by reduced pressure CVD process. At this time, thicknesses of the films are selected such that surface of the nitride film 35 deposited on the N conductivity type diffused layers 26 and 27 would be at a level lower than the surface of the thick field oxide film 22.

Then as shown in FIG. 2i, polyimide resin film 36, for example, is coated on the entire surface of the nitride film 35 by a spinner to form a resin film having flat and smooth surface.

Then, by using dry etching technique or the like, the resin film 36, the silicon nitride film 35 and the polycrystalline silicon film 34 are simultaneously etched off at the uniform etching speed until the upper surface 22A of the thick field oxide film 22 is exposed. By this step, a structure as shown in FIG. 2j can be obtained.

Then as shown in FIG. 2k, the assembly is etched to a thickness that causes the implanted ions to penetrate into the thick oxide film 22 by using the silicon nitride film 35, the polycrystalline silicon film 34 and the resin film 36 deposited on the active region, as a mask.

Then ions are implanted into the oxide films 40 and 41 to form channel stop layers 42 and 43 in the semiconductor silicon substrate 21.

After that, the resin film 36, the silicon nitride film 35, and the polycrystalline silicon film 34 are again etched at the uniform speed to substantially the same level as the thick oxide film 22.

By this treatment, a structure as shown in FIG. 2l can be obtained in which silicon nitride films 61 and 62 are left in the polycrystalline silicon films 44 and 45 on the N conductivity type diffused layers 26 and 27.

Thereafter, the assembly is heat oxidized to oxidize the remaining portions by using the silicon nitride films 61 and 62 as masks. At this time, as shown in FIG. 2m, exposed polycrystalline silicon films 44 and 45 are converted into oxide films 46, 47, 48 and 49.

Again the silicon nitride films 61 and 62 are etched off by using oxide films 46, 47, 48 and 49 as masks to form contact openings 50 and 51 whereby polycrystalline silicon containing impurities are exposed on the N conductivity type diffused films 26 and 27.

Thereafter, wiring conductors are connected to electrodes to obtain a MOS type semiconductor element shown in FIG. 2n.

In FIG. 2n, 81 and 82 designate wiring electrodes extending from the N conductivity type diffused layers 26 and 27 acting as source and drain regions respectively, and 22 designates a thick oxide film acting as a field oxide film. 42 and 43 designate channel stop layers, 24 a silicon gate oxide film acting as a gate insulating film, and 25 a polycrystalline gate electrode.

When a MOS type semiconductor element is prepared by the process steps described above, there are the following advantages.

(1) Since channel stop layers having a high impurity density are formed, after high temperature heat treatments such as gate oxidation, annealing, PSG flow step have been finished, an impurity re-diffusion into the deep area of the semiconductor substrate can be prevented during treatment. As a consequence, there is an advantage that the junction capacitances between channel stop regions and source and drain regions do not increase during the treatment.

(2) Different from selective oxidation technique (LOCOS), since birds' beaks are not formed at the ends of the thick field oxide film and the invasion of the channel stop region to the active region would not occur, the active region can be easily miniaturized, without generating narrow channel effect of the MOS type transistor.

(3) Since electroconductive polycrystalline layer acting as the lead out electrodes of the source and drain regions remains on the diffused layers with substantially the same thickness as that of the other regions, not only the surface becomes smooth and flat but also the formation of the contacts to the diffused layer becomes easy.

In the foregoing embodiment, and in the structure shown in FIG. 2j, if the oxide film has a thickness that permits formation of the channel stop layers 42 and 43 through the oxide film, it is not always necessary to etch the oxide film.

As above described, according to the method of manufacturing a MOS type semiconductor device of this invention, after forming a polycrystalline silicon gate electrode in the active region of a semiconductor silicon substrate, electroconductive diffused layers are formed, an oxide film is formed on the polycrystalline silicon gate electrode, a silicon nitride film, an oxide film and a resin film, each having a thickness smaller than that of the thick oxide film, are formed on the oxide film, then channel stop layers are formed, and the polycrystalline silicon film on the electroconductive diffused layers is exposed to form electrodes so that it is not only possible to reduce the junction capacitance between the substrate and the diffused layers but also birds' beaks would not be formed on the thick oxide film. This not only enables miniaturization of the active region but also prevents narrow channel effect of the MOS type transistor. Moreover since the surface of the transistor can be made smooth and flat, contacts to the electroconductive diffused layers can be formed readily.

What is claimed is:

1. A method of manufacturing a MOS type semiconductor device comprising the steps of:

forming a relatively thick oxide film on a semiconductor substrate;

removing a portion of said oxide film to expose a portion of said semiconductor substrate which is used to form an active region;

forming a polycrystalline silicon gate electrode on said exposed portion of said semiconductor substrate;

forming diffused layers being of a conductivity type opposite to that of said semiconductor substrate in said exposed portion thereof;

forming an oxide film on said polycrystalline silicon gate electrode;

depositing a polycrystalline silicon film, a silicon nitride film and a resin film on said polycrystalline silicon gate electrode to form a flat surface such that the flat surface of the active region would lie at a level lower than an upper surface of said relatively thick oxide film;

etching off said relatively thick oxide film to have a predetermined thickness by utilizing said polycrystalline silicon film, said silicon nitride film, and said resin film as a mask;

implanting ions of an impurity into said semiconductor substrate to form channel stop layers; and exposing said polycrystalline silicon film on said diffused layers to form electrodes.

2. The method according to claim 1 wherein said semiconductor substrate comprises P type silicon.

3. The method according to claim 1 wherein said relatively thick oxide film has a thickness of 0.5–1 micron.

4. The method according to claim 1 wherein said diffused layers have N conductivity type and an impurity concentration of about $10^{20}/cm^3$.

5. The method according to claim 1 which further comprises the step of forming oxide films on said diffused layers and said polycrystalline silicon gate electrode.

6. The method according to claim 5 wherein the oxide film on said polycrystalline silicon gate electrode is thicker than that of the oxide films on said diffused layers.

7. The method according to claim 1 wherein said polycrystalline silicon film contains an N type impurity at a concentration of from $10^{20}$–$10^{21}/cm^3$.

* * * * *